(12) United States Patent
Hoshi et al.

(10) Patent No.: US 6,252,266 B1
(45) Date of Patent: Jun. 26, 2001

(54) FIELD EFFECT TRANSISTOR WITH COMB ELECTRODES AND VIA HOLES

(75) Inventors: Hiroyuki Hoshi; Hitoshi Kurusu, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/350,525

(22) Filed: Jul. 12, 1999

(30) Foreign Application Priority Data

Aug. 26, 1998 (JP) .................................................. 10-240051
Feb. 8, 1999 (JP) .................................................. 11-029982

(51) Int. Cl.[7] ................................................ H01L 29/80
(52) U.S. Cl. .......................................... 257/276; 257/774
(58) Field of Search .................................. 257/275, 276, 257/774

(56) References Cited

U.S. PATENT DOCUMENTS

| 5,023,677 | 6/1991 | Truitt ..................................... 257/276 |
| 5,925,901 | * 7/1999 | Tsutsui .................................. 257/276 |
| 6,081,006 | * 6/2000 | Nelson .................................. 257/276 |

FOREIGN PATENT DOCUMENTS 8274116   10/1996   (JP) .

* cited by examiner

Primary Examiner—Gene M. Munson
(74) Attorney, Agent, or Firm—Leydig, Voit & Mayer, Ltd.

(57) ABSTRACT

A semiconductor device with a field-effect transistor for use at a high frequency, higher than the microwave frequency band, has a pair of grounding electrodes, each having a via hole with an elliptical cross-section, the major axis of which is parallel to a direction in which source electrodes are arranged. Instead of the elliptical via hole, each grounding electrode may have via holes through which the grounding electrode is grounded.

12 Claims, 13 Drawing Sheets

FIELD EFFECT TRANSISTOR WITH COMB ELECTRODES AND VIA HOLES

BACKGROUND OF THE INVENTION

1. Field of the Invention

The present invention relates to a semiconductor device employing a field-effect transistor having a gate electrode with a comb-shaped structure and, more particularly, to the semiconductor device having a structure designed to minimize a reduction in gain in a high frequency band not lower than the microwave band.

2. Description of the Prior Art

An example of the prior art field-effect transistor having a gate electrode with a comb-shaped structure is shown in FIG. 19. Referring to FIG. 19, the field-effect transistor (or the FET) 200 to be used at a high frequency higher than the microwave band is provided with a gate electrode 201 having a comb-shaped structure, a drain electrode 202 similarly having a comb-shaped structure and an array of source electrodes 204 that are connected together by way of an air bridge 203. The source electrodes located at both ends of the array of the source electrodes 204 are connected to corresponding grounding electrodes 206a and 206b grounded by way of via holes 205a and 205b.

A semiconductor chip having the FET 200 formed thereon has test electrodes 210a, 210b, 220a and 220b formed thereon that are used during a on-wafer examination to determine operating characteristics of the FET 200 on the wafer. The test electrodes 210a, 210b, 220a and 220b are connected in correspondence with test pads 211a, 211b, 221a and 221b, respectively, that are used for connection with a test machine during the on-wafer examination.

The test pads 211a, 211b, 221a and 221b are connected to the ground through the corresponding via holes 212a, 212b, 222a and 222b. A high frequency signal inputted from an external circuit by way of a connection pad 213, formed between the test pads 211a and 211b, during the on-wafer examination is inputted to the gate electrode 201 through a signal line 214. The high frequency signal inputted is amplified by the FET 200, and the amplified high frequency signal is outputted from a connection pad 223, formed between the test pads 221a and 221b, through the drain electrode 202 by way of a signal line 224. The connection pads 213 and 223 are connected with an external circuit when the FET 200 available as a commercial product is used.

In the above construction, the field-effect transistor 200 has a parasitic impedance comprised of a source resistance Rs and a parasitic inductance (referred to as a source inductance hereinafter) Ls on the source electrode side, which are generated due to the structure of the source electrodes, the grounding electrodes and the via holes.

FIG. 20 is a graph showing a relation between a unit gate width Wgu and a total gate width Wgt of the gate electrode 201 with respect to the source inductance Ls of the FET 200 shown in FIG. 19. FIG. 20 shows the fact that the source inductance Ls increases according to a reduction in the unit gate width Wgu and an increase in the total gate width Wgt.

On the other hand, FIG. 21 illustrates an equivalent circuit of the FET 200 during the on-wafer examination. As shown therein, during the on-wafer examination, in addition to the source inductance Ls, a parasitic impedance Lt is also generated due to the structure of the test electrodes 210a, 210b, 220a and 220b and the via holes 212a, 212b, 222a and 222b. Reference character Rs used in FIG. 21 represents a source resistance of the FET 200.

As described above, there has been the conventional problem that the gain of the FET 200 reduces to deteriorate the high-frequency characteristics because of the increase in frequency and the increase in the parasitic impedance accompanying the increase in the total gate width of the FET 200. This has resulted in a difficulty in obtaining both a high gain and a large output power in the high frequency band with the prior art FET 200 having the comb-shaped gate structure.

It is to be noted that a field-effect transistor in which the source inductance of the via holes is reduced by arranging a plurality of via holes in a source electrode pad is disclosed in, for example, Japanese Patent Laid-Open Publication No. 8-274116.

SUMMARY OF THE INVENTION

The present invention has been made to solve the aforementioned problems and has the object of obtaining a semiconductor device employing an field-effect transistor which can prevent a reduction in gain in a high frequency band higher than the microwave band attributed to an increase in the total gate width, to thereby improve the high-frequency characteristics by reducing the parasitic impedance and which is effective to increase the accuracy of various measurements conducted during the on-wafer examination.

In order to achieve this object, there is provided a semiconductor device employing a field-effect transistor which has a gate electrode and a drain electrode of a comb-shaped structure and in which a plurality of source electrodes arranged in an identical axis are connected together by way of a conductor, the semiconductor device comprising via holes for grounding corresponding grounding electrodes connected to corresponding source electrodes located in both end positions of the source electrodes, the via holes each having an elliptical shape.

By virtue of the elliptical shape of the via holes, a distance from the source electrode connected to the grounding electrode to a signal transmission path in the via hole can be reduced, and the signal transmission path in the via hole increased. Therefore, the parasitic inductance of the via holes can be reduced and the parasitic impedance ascribed to the grounding of the source electrodes by means of the grounding electrodes and the via holes can be reduced, so that a high-frequency characteristic deterioration such as a reduction in gain in a high frequency band higher than the microwave band can be prevented.

According to another aspect of the present invention, there is provided a semiconductor device employing a field-effect transistor which has a gate electrode and a drain electrode of a comb-shaped structure and in which a plurality of source electrodes arranged in an identical axis are connected together by way of a conductor, wherein grounding electrodes connected to corresponding source electrodes located in both end positions of the source electrodes are grounded by way of a plurality of via holes. With this arrangement, the parasitic inductance of the via holes can be totally reduced. Therefore, the parasitic impedance ascribed to the grounding of the source electrodes by means of the grounding electrodes and the via holes can be reduced, so that a high-frequency characteristic deterioration such as a reduction in gain in a high frequency band higher than the microwave band can be prevented.

It is preferred that the via holes provided in correspondence with the respective grounding electrodes should be arranged in positions symmetrical about the axis of the array of the source electrodes. With this arrangement, the parasitic inductance of the via holes can be further reduced. Therefore, the parasitic impedance ascribed to the grounding of the source electrodes by means of the grounding electrodes and the via holes can be further reduced, so that a high-frequency characteristic deterioration such as a reduction in gain in a high frequency band not lower than the microwave band can be more surely prevented.

It is preferred that at least one of the via holes provided for one grounding electrode should be arranged in the vicinity of the drain electrode and/or the gate electrode while being not put in contact with the electrodes, and an end portion that belongs to the grounding electrode and is located close to the via hole arranged in the vicinity of the drain electrode and/or the gate electrode should be connected to the nearby source electrode by means of a conductor. In this case, the parasitic inductance component of the conductor included in the source inductance of the field-effect transistor can be reduced by the via holes. Particularly, the parasitic inductance component of the conductor can be effectively reduced in a field-effect transistor having many fingers of the gate electrode and the drain electrode and a great total gate width. Therefore, the parasitic impedance ascribed to the grounding of the source electrodes by means of the grounding electrodes and the via holes can be reduced, so that a high-frequency characteristic deterioration such as a reduction in gain in a high frequency band not lower than the microwave band can be prevented.

It is preferred that each of the via holes should have a hole depth smaller than a thickness of a substrate on which the field-effect transistor is formed. With this arrangement, the parasitic inductance of the via holes can be reduced and the source inductance of the field-effect transistor can be reduced. Therefore, the parasitic impedance ascribed to the grounding of the source electrodes by means of the grounding electrodes and the via holes can be reduced, so that a high-frequency characteristic deterioration such as a reduction in gain in a high frequency band not lower than the microwave band can be prevented.

In the case where the depth of the via hole has the above dimensions, it is preferred that a recess portion should be further provided on a rear surface of the substrate surface on which the field-effect transistor is formed, and the recess portion should be formed in the position where the via hole is formed.

Preferably, the semiconductor device includes at least one test pad which may be connected with a test machine when a predetermined test is conducted, at least one test electrode connected with the test pad, and a test via hole defined in the test electrode for connecting the test electrode to the ground. The test via hole has a cross-sectional area larger than that of the via hole for each grounding electrode. This is particularly advantageous in that during the predetermined test is conducted on the semiconductor device during the on-wafer examination, an unnecessary parasitic inductance brought about by the test via hole can be reduced, to thereby avoid any possible reduction in measurement accuracy at a high frequency region.

Where the semiconductor device has the plural via holes for each grounding electrode, the test via hole should have a cross-sectional area larger than the sum of respective cross-sectional areas of the via holes for each grounding electrode. On the other hand, where a plurality of test via holes are employed for each grounding electrode, the sum of respective cross-sectional areas of said via holes should be larger than that of the via hole for each grounding electrode.

Again preferably, respective portions of at least one of the test via holes and the test electrode having the test via holes defined therein are formed on a chip cutting region on a wafer along which the semiconductor chip is cut, such that when the semiconductor chip is cut along the chip cutting region said portions of the test via hole and the test electrode are separated from each other. Those respective portions of the test via hole and the test electrode are concurrently used by respective field-effect transistors formed on the wafer in neighboring relation to each other. This is particularly advantageous in that unnecessary portions for the FET can be reduced, making it possible to miniaturize the semiconductor chip that is used to fabricate the FET.

BRIEF DESCRIPTION OF THE DRAWINGS

The present invention will become readily understood from the following description of preferred embodiments thereof made with reference to the accompanying drawings, in which like parts are designated by like reference numeral and in which.

DETAILED DESCRIPTION OF THE EMBODIMENTS

Figure 1:
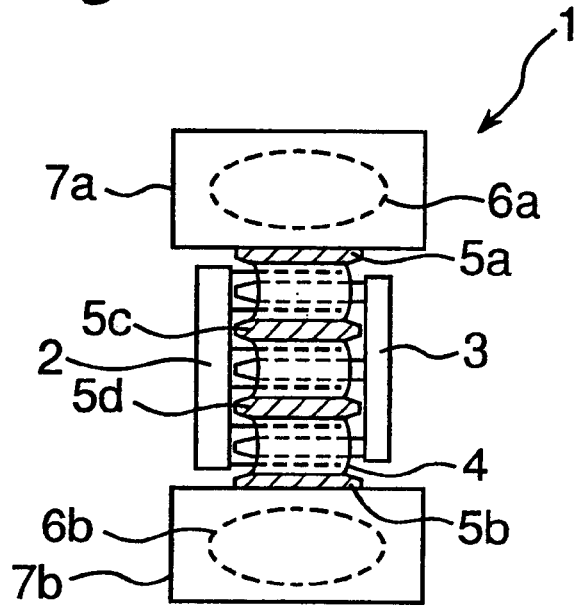
FIG. 1 is a view showing a semiconductor device according to a first embodiment of the present invention.

The present invention will be described in detail below on the basis of the embodiments shown in the drawings.

<First Embodiment>

FIG. 1 is a view showing a semiconductor device according to the first embodiment of the present invention. FIG. 1 shows the structure of a field-effect transistor having a comb-shaped gate structure. Referring to FIG. 1, a field-effect transistor (referred to as an FET hereinafter) 1 to be used at a frequency higher than the microwave band is provided with a gate electrode 2 having a comb-shaped structure, a drain electrode 3 similarly having a comb-shaped structure and source electrodes 5a through 5d connected together by way of air bridges 4. The source electrodes 5a and 5b located at both ends of the source electrodes 5a through 5d are connected to corresponding grounding electrodes 7a and 7b grounded by way of via holes 6a and 6b, respectively. The via holes 6a and 6b have an elliptical cylindrical shape, and the elliptical cylindrical holes are formed so that the major axis of the ellipses constituting opening portions are perpendicular to the array of the source electrodes 5a through 5d.

The grounding electrodes 7a and 7b have a rectangular shape of a size capable of covering the elliptical opening portions of the via holes 6a and 6b and cover one opening portion of the via holes 6a and 6b. The source electrode 5a is connected to one long side of the grounding electrode 7a, while the source electrode 5b is connected to one long side of the grounding electrode 7b.

With this arrangement, the distance from the source electrode connected to the grounding electrode to a signal transmission path in the via hole can be reduced, and the signal transmission path in the via hole increased.

Figure 2:
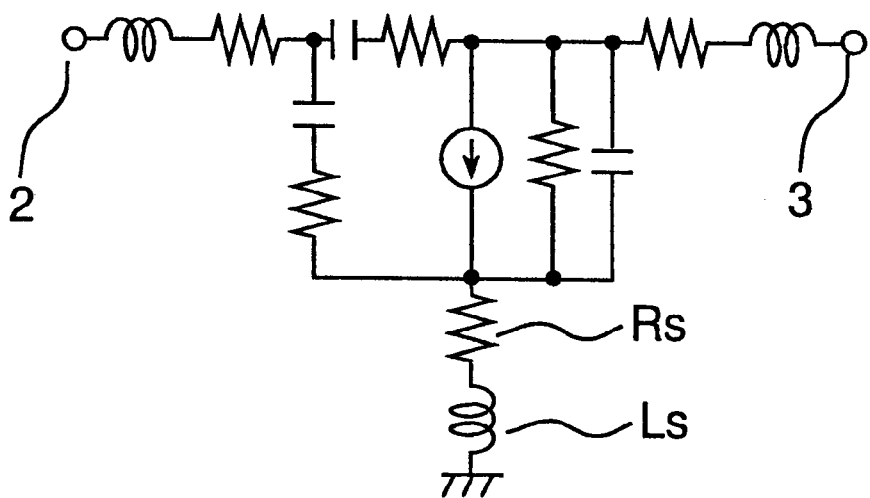
FIG. 2 is a circuit diagram showing an equivalent circuit of the field-effect transistor 1 shown in FIG. 1.

FIG. 2 is a circuit diagram showing the equivalent circuit of the FET 1 shown in FIG. 1. Referring to FIG. 2, reference character Rs denotes a source resistance, while reference character Ls denotes the parasitic inductance on the source electrode side (referred to as a source inductance hereinafter), and the source resistance Rs and the source inductance Ls constitute a parasitic impedance.

Figure 3:
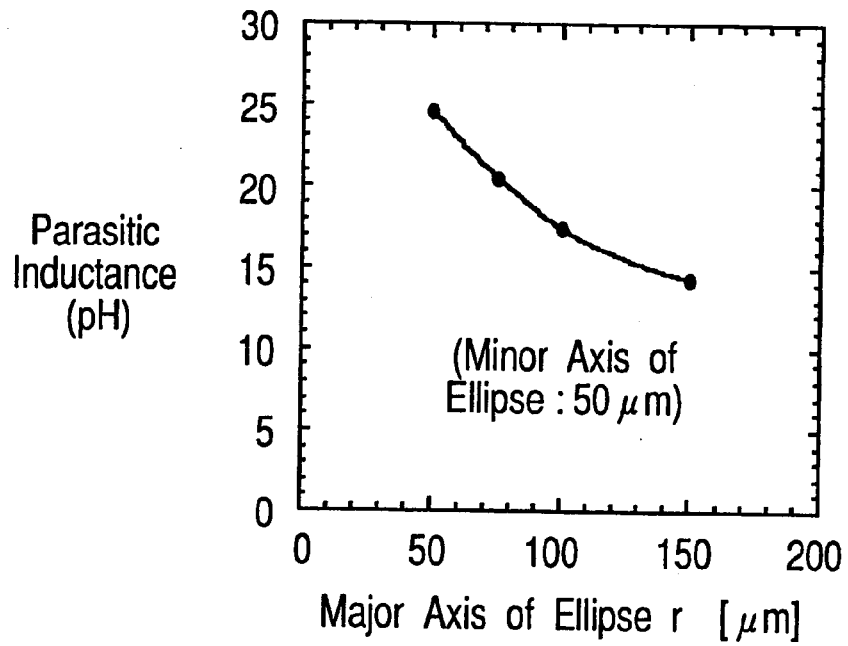
FIG. 3 is a graph showing a relation between the diameter of the ellipse and the parasitic inductance of the via hole shown in FIG. 1.

FIG. 3 is a graph showing a relation between the major axis r of the ellipse of the via holes 6a and 6b and the parasitic inductance of either one of the via holes 6a and 6b. It is to be noted that FIG. 3 shows the case where the minor axis of the ellipse is 50 μm, meaning that the via hole has a circular form if the major axis of the ellipse is 50 μm. It can be understood from FIG. 3 that the inductance of the via hole reduces as the major axis of the ellipse is increased.

As described above, the via holes 6a and 6b have an elliptical cylindrical shape in the semiconductor device of the present first embodiment. Therefore, the parasitic inductance of the via holes can be reduced and the parasitic impedance attributed to the grounding of the source electrode by means of the grounding electrodes and the via holes can be reduced, so that a high-frequency characteristic deterioration such as a reduction in gain of the field-effect transistor in a high frequency band higher than the microwave band can be prevented.

<Second Embodiment>

Figure 4:
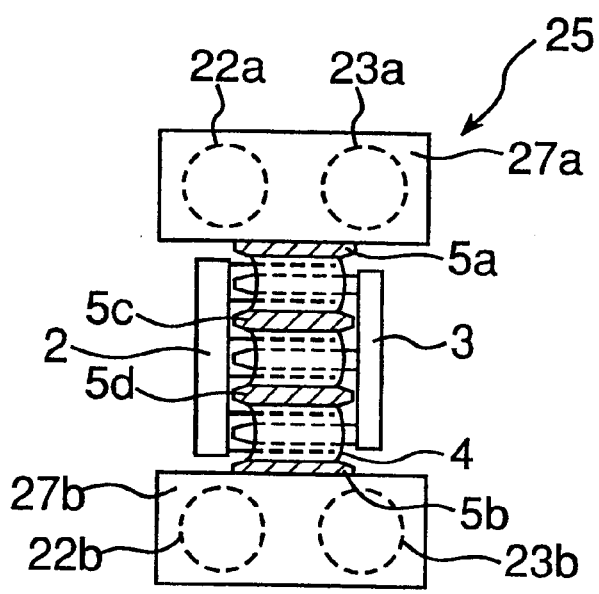
FIG. 4 is a view showing a semiconductor device according to a second embodiment of the present invention.

Although one via hole is formed in one grounding electrode in the first embodiment, a plurality of via holes may be provided for one grounding electrode as in the second embodiment shown in FIG. 4.

FIG. 4 differs from FIG. 1 in that two cylindrical via holes are provided for each grounding electrode. The grounding electrode connected to the source electrode 5a is used as a grounding electrode 27a, while the grounding electrode connected to the source electrode 5b is used as a grounding electrode 27b. The grounding electrode 27a is grounded by way of two via holes 22a and 23a and the grounding electrode 27b is grounded by way of two via holes 22b and 23b. In accordance with this arrangement, the FET according to this embodiment is referred to as FET 25.

Referring to FIG. 4, the FET 25 to be used at a frequency higher than the microwave band is provided with a gate electrode 2, a drain electrode 3 and source electrodes 5a through 5d connected together by way of an air bridge 4. The source electrode 5a is connected to the grounding electrode 27a grounded by way of the via holes 22a and 23a, while the source electrode 5b is connected to the grounding electrode 27b grounded by way of the via holes 22b and 23b. The via holes 22a, 23a, 22b and 23b have a cylindrical shape. The via holes 22a and 23a are formed at an equal distance in the nearest vicinity of the center of the source electrode 5a, while the via holes 22b and 23b are formed at an equal distance in the nearest vicinity of the center of the source electrode 5b.

Figure 5:
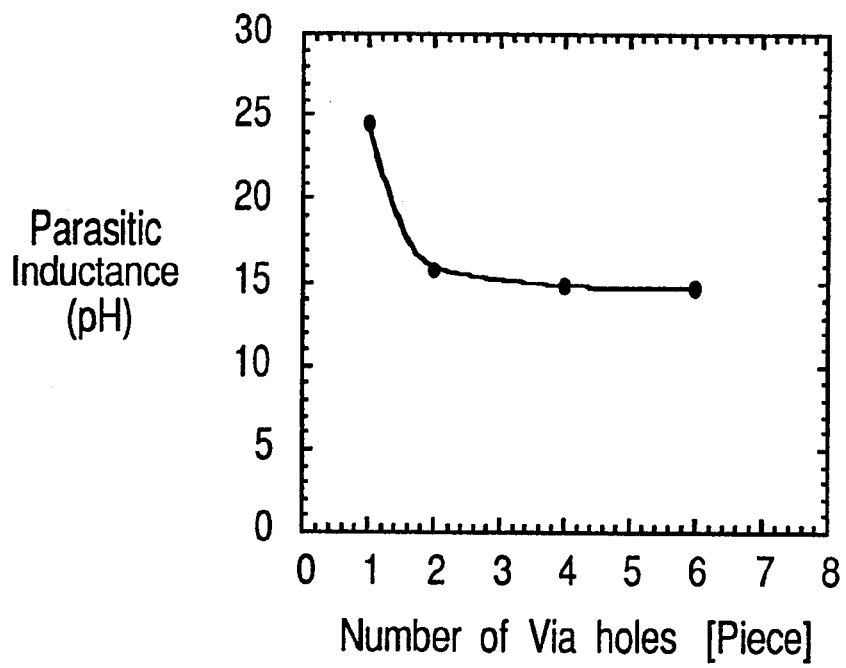
FIG. 5 is a graph showing a relation between the number of via holes and the total parasitic inductance of the via holes with respect to one grounding electrode.

FIG. 5 is a graph showing a relation between the number of via holes and the total parasitic inductance of the via holes with respect to one grounding electrode. It can be understood from FIG. 5 that the total parasitic inductance of the via holes reduces as the number of the via holes per grounding electrode increases.

Figure 6:
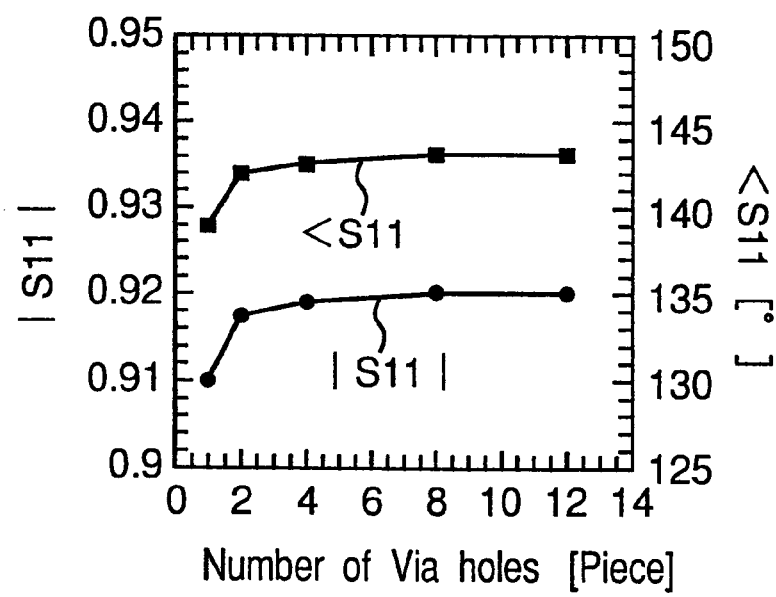
FIG. 6 is a graph showing a relation between the absolute value of S11 of an S parameter, the angle of the S11 and the number of the via holes for each grounding electrode.
Figure 7:
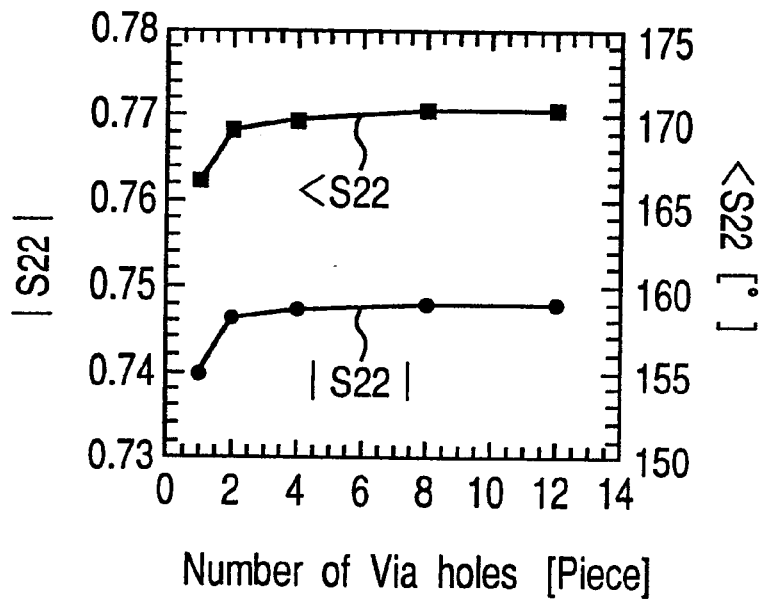
FIG. 7 is a graph showing a relation between the absolute value of S22 of an S parameter, the angle of the S22 and the number of the via holes for each grounding electrode.

FIG. 6 illustrates the relation between any of the absolute value and the angle (shown by <S11 in FIG. 6) of S11 of an S parameter in the FET and the number of the via holes employed for each grounding electrode whereas FIG. 7 illustrates the relation between any of the absolute value and the angle (shown by <S11 in FIG. 7) of the S parameter in the FET and the number of the via holes employed for each grounding electrode. FIGS. 6 and 7 make it clear that change in number of the via holes results in change in intrinsic impedance of the FET for impedance matching.

Figure 8:
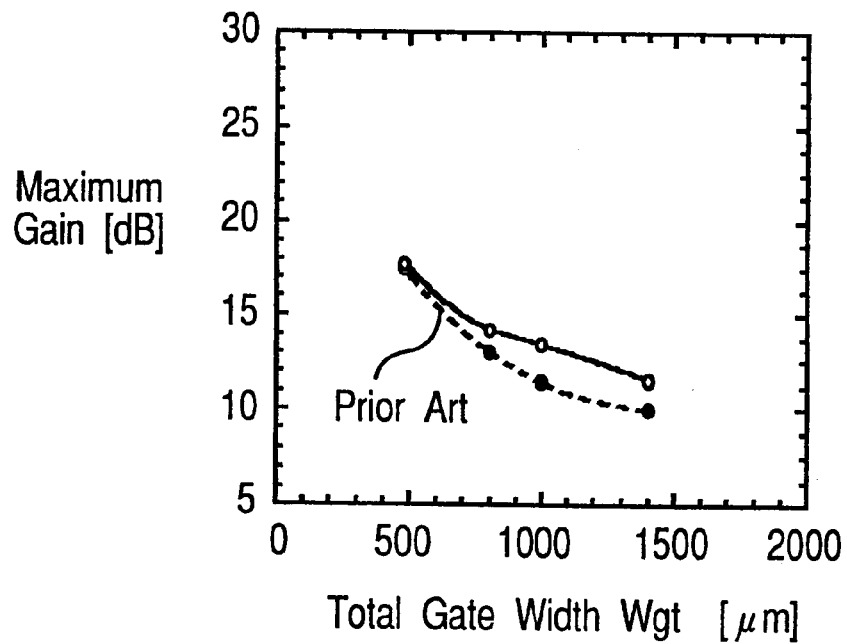
FIG. 8 is a graph showing a relation between the total gate width and the maximum gain of the field-effect transistor 25 shown in FIG. 4.

FIG. 8 is a graph showing a relation between the total gate width Wgt and the maximum gain of the FET 25 shown in FIG. 4. Referring to FIG. 8, the curve shown by the dashed line indicates the conventional case where one via hole is provided for one grounding electrode, while the curve shown by the solid line indicates the case where two via holes are provided for one grounding electrode as shown in FIG. 4. It can be understood from FIG. 8 that the higher maximum gain can be obtained when two via holes are provided for one grounding electrode.

Figure 9:
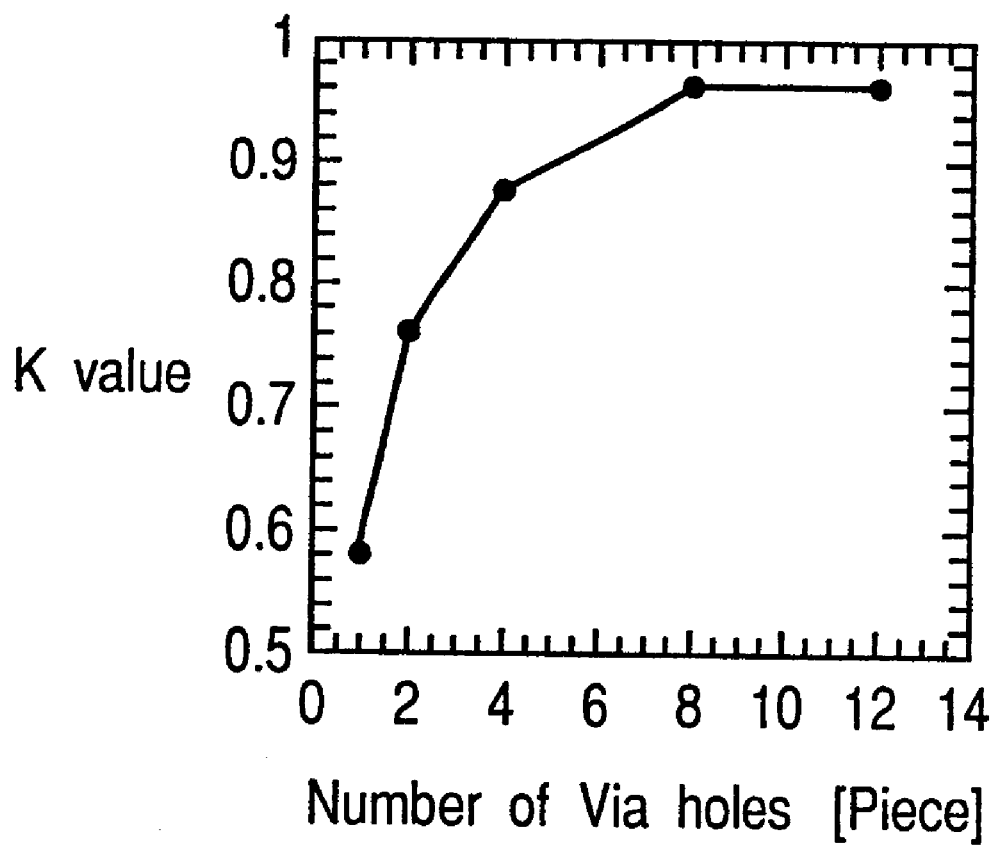
FIG. 9 is a graph showing a relation between the stability factor in the field-effect transistor and the number of the via holes for each grounding electrode.

Although the two via holes are provided for one grounding electrode in the present second embodiment, the present invention is not limited to this, and it is proper to achieve the grounding of one grounding electrode by way of a plurality of via holes. FIG. 9 illustrates a relation between the K value, which is descriptive of the stability factor of the FET, and the number of the via holes employed for each grounding electrode, and it will readily be seen from FIG. 9 that increase in number of the via hole is effective to stabilize the operation of the FET.

As described above, one grounding electrode is grounded by way of a plurality of via holes in the semiconductor device of the present second embodiment. With this arrangement, the parasitic inductance of the via holes can be totally reduced and the parasitic impedance ascribed to the grounding of the source electrodes by means of the grounding electrodes and the via holes can be reduced, so that a high-frequency characteristic deterioration such as a reduction in the gain of the FET in a high frequency band not lower than the microwave band can be minimized.

Also, by changing the number of the via holes employed for each grounding electrode and the cross-sectional shape of each via hole, the intrinsic impedance and the operating characteristic can be changed. In particular, in the case of a low-noise amplifier, the noise characteristic and the gain can be improved by reducing the number of the via holes used for each grounding electrode and reducing the section of each via hole. On the other hand, in the case of a high-output amplifier, the input and output characteristic and the gain can be improved by increasing the number of the via holes used for each grounding electrode and increasing the section of each via hole.

<Third Embodiment>

The via holes of one grounding electrode are formed at an equal distance in the nearest vicinity of the center of the source electrode in the second embodiment. However, when providing a plurality of via holes for one grounding electrode, at least one of the via holes may be located in the nearest vicinity of the drain electrode and/or the gate electrode while being not put in contact with the electrodes. The semiconductor device of the third embodiment of the present invention is constructed as described above.

Figure 10:
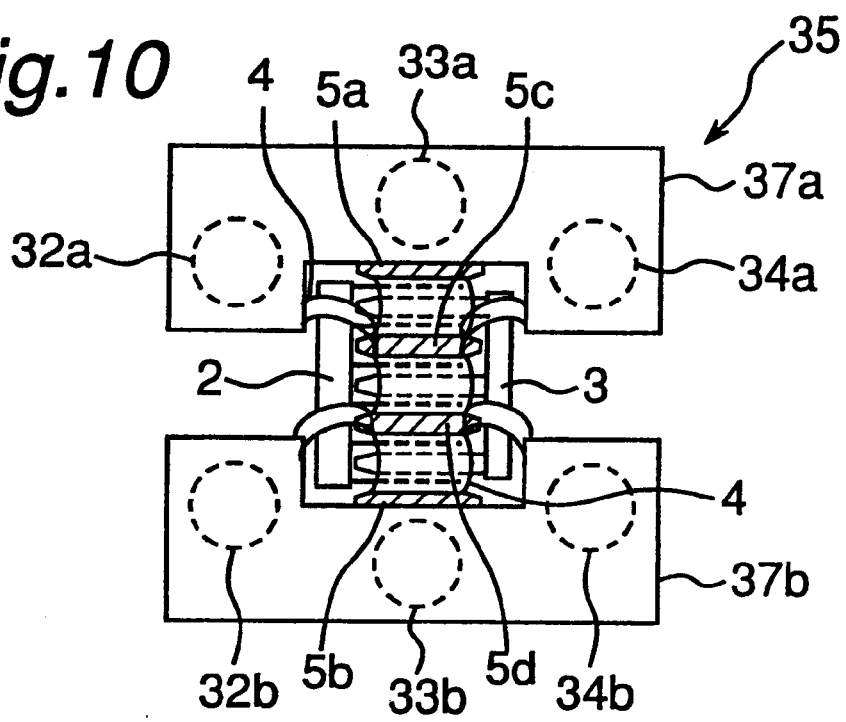
FIG. 10 is a view showing a semiconductor device according to a third embodiment of the present invention.

As is the case with the FET shown in FIG. 1, the field-effect transistor show in FIG. 10 has a comb-shaped gate structure. It is to be noted that FIG. 10 shows an example in which three via holes are provided for one grounding electrode.

FIG. 10 differs from FIG. 4 in that at least one via hole among a plurality of via holes provided for one grounding electrode is arranged in the nearest vicinity of the gate electrode 2 and/or the drain electrode 3 while being not put in contact with the electrodes. With this arrangement, the grounding electrode connected to the source electrode 5a is used as a grounding electrode 37a, and the grounding electrode connected to the source electrode 5b is used as a grounding electrode 37b. The grounding electrode 37a is grounded by way of three via holes 32a, 33a and 34a and the grounding electrode 37b is grounded by way of three via holes 32b, 33b and 34b. In accordance with this arrangement, the FET according to this embodiment is referred to as FET 35.

Referring to FIG. 10, the FET 35 to be used at a frequency higher than the microwave band is provided with a gate electrode 2, a drain electrode 3 and source electrodes 5a through 5d connected together by way of air bridges 4. The source electrode 5a is connected to the grounding electrode 37a grounded by way of the via holes 32a, 33a and 34a, while the source electrode 5b is connected to the grounding electrode 37b grounded by way of the via holes 32b, 33b and 34b.

The via holes 32a through 34a and 32b through 34b have a cylindrical shape. The via holes 32a and 32b are provided on the gate electrode 2 side, the via holes 33a and 33b are provided on the source electrodes 5a and 5b side and the via holes 34a and 34b are provided on the drain electrode 3 side so as to be located in the nearest vicinity of the respective electrodes while being not put in contact with the electrodes. Thus, the via holes 32a through 34a and 32b through 34b are arranged so as to surround the FET constructed of the gate electrode 2, the drain electrode 3 and the source electrodes 5a through 5d.

Further, the source electrodes 5a and 5c, the source electrodes 5c and 5d, the source electrodes 5d and 5b are connected together by way of the air bridge 4, while the source electrode 5c and the portions that belong to the grounding electrode 37a and are located in the vicinity of the via holes 32a and 34a are connected together by way of the air bridge 4. Likewise, the source electrode 5d and the portions that belong to the grounding electrode 37b and located in the vicinity of the via holes 32b and 34b are connected together by way of the air bridges 4.

With this arrangement, the semiconductor device of the present third embodiment can reduce the inductance component of the air bridge 4 included in the source inductance Ls by means of the via holes. Particularly, the parasitic inductance component of the air bridge 4 can be effectively reduced in a field-effect transistor having many fingers of the gate electrode 2 and the drain electrode 3 and a great total gate width. Therefore, the parasitic impedance ascribed to the grounding of the source electrodes by means of the grounding electrodes and the via holes can be reduced, so that a high-frequency characteristic deterioration such as a reduction in the gain of the FET in a high frequency band not lower than the microwave band can be prevented.

<Fourth Embodiment>

Figure 11:
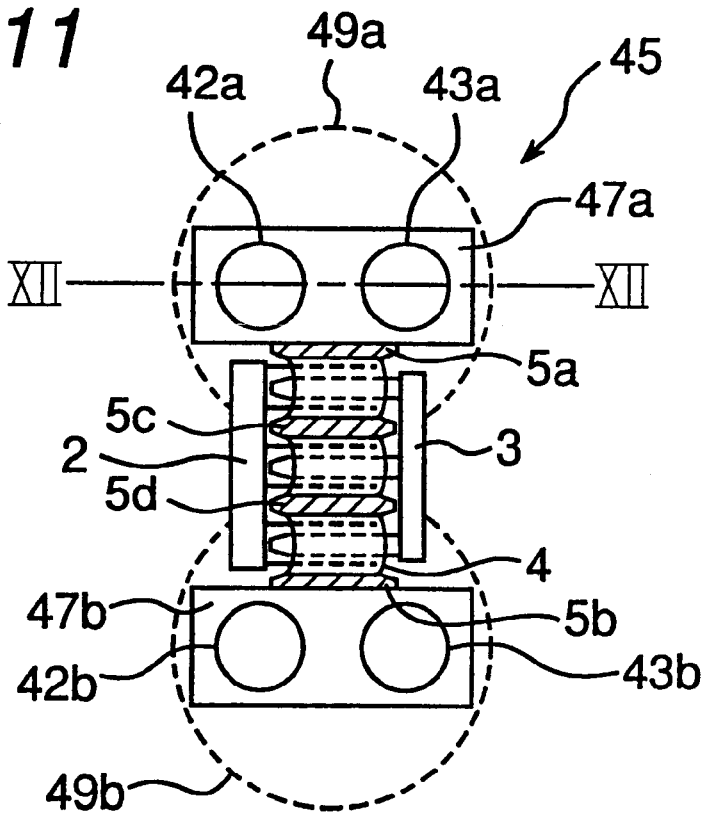
FIG. 11 is a view showing a semiconductor device according to a fourth embodiment of the present invention.

In the first through third embodiments, the depth of each via hole is equal to the thickness of the substrate on which the FET is formed, and the hole shape is constant. However, in the fourth embodiment, the hole shape of the via hole is increased partway. FIG. 11 is a view showing the semiconductor device according to the fourth embodiment of the present invention. As is the case with the FET shown in FIG. 1, the field-effect transistor has a comb-shaped gate structure, while FIG. 12 shows the cross section of the portion along the line XII—XII in FIG. 11.

Figure 12:
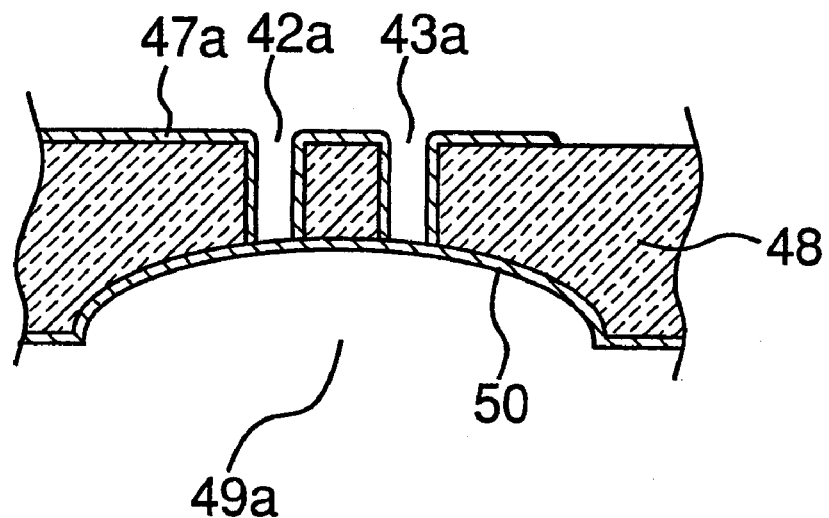
FIG. 12 is a view showing a cross section of a portion along the line XII—XII in FIG. 11.

Referring to FIGS. 11 and 12, the FET 45 to be used at a frequency higher than the microwave band is provided with a gate electrode 2, a drain electrode 3 and source electrodes 5a through 5d connected together by way of an air bridge 4. The source electrode 5a is connected to a grounding electrode 47a grounded by way of via holes 42a and 43a, while the source electrode 5b is connected to a grounding electrode 47b grounded by way of via holes 42b and 43b. The via holes 42a, 43a, 42b and 43b have a cylindrical shape.

The rear surface of a substrate 48, which is opposite from the surface on which the FET is formed and located in the positions in which the via holes 42a and 43a are formed has a concave surface formed with a recess portion 49a. Likewise, the rear surface of the substrate 48, which is opposite from the surface on which the FET is formed and located in the positions in which the via holes 42b and 43b are formed has a concave surface formed with a recess portion 49b. On the concave surfaces of the recess portions 49a and 49b is formed an electrode 50, and the electrode 50 is connected to the corresponding grounding electrode by way of a via hole.

Figure 13:
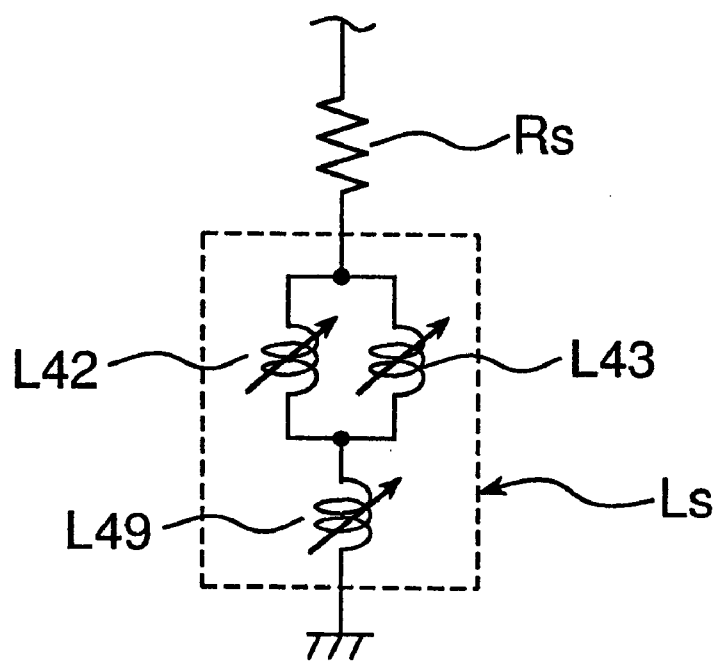
FIG. 13 is a circuit diagram showing an equivalent circuit of a parasitic inductance at each of via holes 42a and 43a and a recess portion 49a shown in FIG. 9.

FIG. 13 is a circuit diagram showing the equivalent circuit of the parasitic inductance of the via holes 42a and 43a and the recess portion 49a shown in FIG. 12. Referring to FIG. 13, a parasitic inductance L42 of the via hole 42a and a parasitic inductance L43 of the via hole 43a are connected in parallel with each other, and a parasitic inductance L49 of the recess portion 49a is connected between the parallel circuit and the ground. The circuit shown in FIG. 13 constitutes the source inductance Ls shown in FIG. 2 and is connected to the source resistance Rs shown in FIG. 2.

The parasitic inductance L42 and L43 each increase as the hole depth of the corresponding via hole increases, while the parasitic inductance L49 reduces as the size of the opening portion of the recess portion 49a increases. For this reason, by increasing the depth of each of the recess portions 49a and 49b and increasing the size of each opening portion, the source inductance Ls of the FET 45 reduces.

Although the present fourth embodiment has been described on the example in which two via holes are formed for one grounding electrode, the present invention is not limited to this, and the above structure is effective in the case where at least one via hole is formed for one grounding electrode.

As described above, in the semiconductor device of the present fourth embodiment, the source inductance Ls is reduced by adjusting the hole depth of each of the via holes 42a and 43a by the recess portion 49a, adjusting the hole depth of each of the via holes 42b and 43b by the recess portion 49b and adjusting the size of the opening portions of the recess portions 49a and 49b. With this arrangement, the total parasitic inductance of the via holes and the recess portions can be reduced, thereby allowing the source inductance of the FET to be reduced. Therefore, the parasitic impedance ascribed to the grounding of the source electrodes by means of the grounding electrodes and the via holes can be reduced, so that a high-frequency characteristic deterioration such as a reduction in the gain of the FET in a high frequency band not lower than the microwave band can be prevented.

<Fifth Embodiment>

Figure 14:
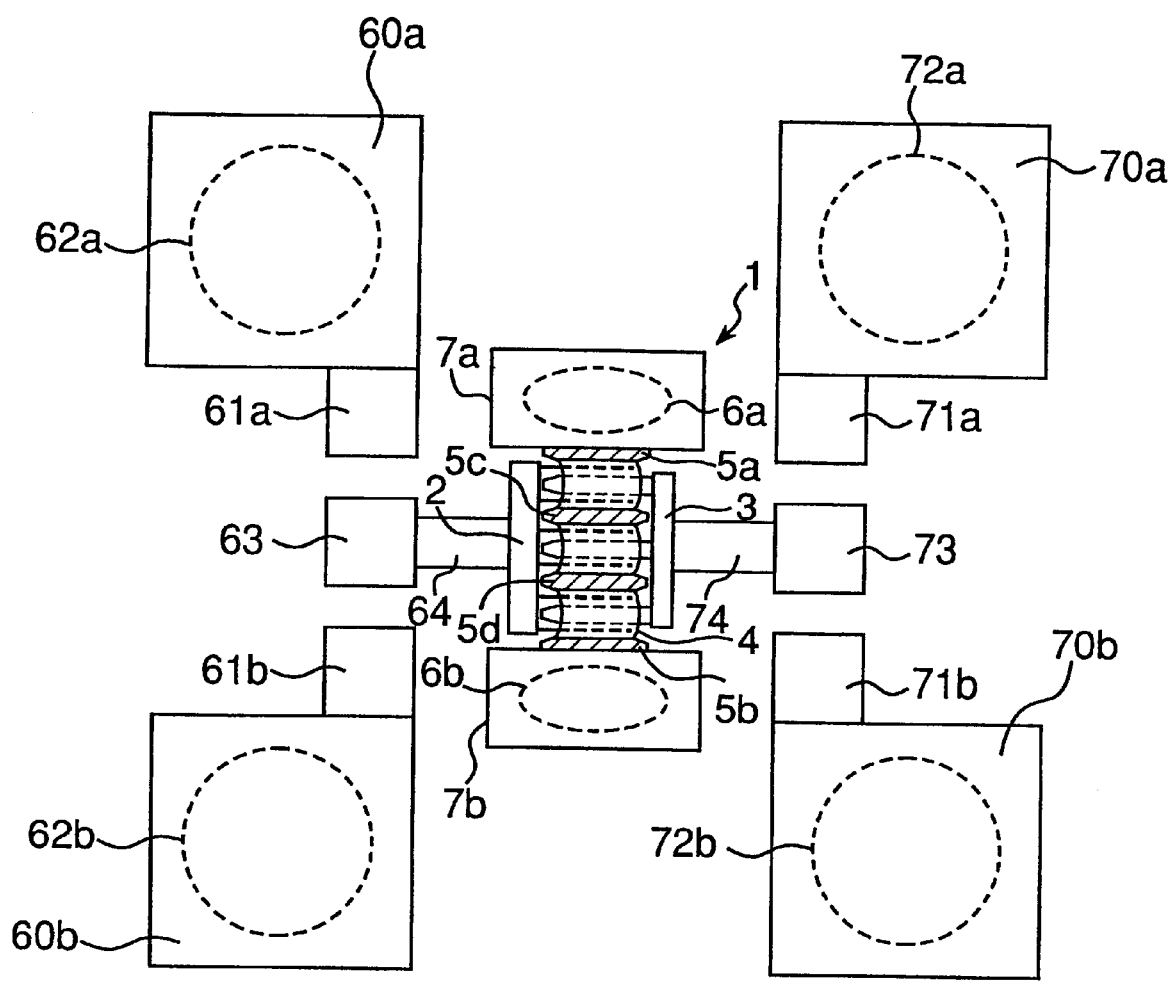
FIG. 14 is a view showing a semiconductor device according to a fifth embodiment of the present invention.

Although in describing the first to fourth embodiments of the present invention, the structural details of the FET have been described, the FET may be provided with various pads, electrodes and via holes that are used during a on-wafer examination which is carried out at the time of manufacture of the FET The FET provided with those pads, electrodes and via holes will now be described in connection with a fifth embodiment of the present invention shown in FIG. 14, it being, however, to be noted that the FET shown in FIG. 14 is that which has been described with reference to FIG. 1 in connection with the first embodiment of the present invention.

The FET shown in FIG. 14 has the comb-shaped gate structure as is the case with that shown in FIG. 1, component parts of which are designated by like reference numerals used in FIG. 1. As shown therein, a semiconductor chip, or a FET carrier chip, on which the FET 1 is fabricated is formed with test electrodes 60a and 60b that are used during the on-wafer examination to determine the operating characteristic of the FET in the form as residing on a wafer. The test electrodes 60a and 60b are connected respectively with test pads 61a and 61b that are used during the on-wafer examination for connection with a test machine.

The test electrodes 60a and 60b are grounded through respective via holes 62a and 62b and, hence, the test pads 61a and 61b are grounded. A connection pad 63 for connection with the test machine during the on-wafer examination, but with an external circuit when the FET 1 is used, is formed between the test pads 61a and 61b. This connection pad 63 is in turn connected with the gate electrode 2 through a signal line 64.

The FET carrier chip referred to above is also formed with test electrodes 70a and 70b which are connected with respective test pads 71a and 71b that are used for connection with the test machine during the on-wafer examination. The test electrodes 70a and 70b are grounded through respective via holes 72a and 72b and, hence, the test pads 71a and 71b are grounded. A connection pad 73 for connection with the test machine during the on-wafer examination, but with an external circuit when the FET 1 is used, is formed between the test pads 71a and 71b. This connection pad 73 is in turn connected with the drain electrode 3 through a signal line 74.

Each of the via holes 62a, 62b, 72a and 72b for test purpose is of a substantially cylindrical shape having a diameter greater than the diameter of each vial hole 6a or 6b along the major axis thereof. At least, each of the via holes 62a, 62b, 72a and 72b for test purpose has the surface area of the opening greater than that of each via hole 6a or 6b in the FET 1. Each of the test electrodes 60a, 60b, 70a and 70b is of a shape, for example, square as shown in FIG. 14 and is of a size sufficient to cover the opening of the associated via hole 62a, 62b, 72a or 72b and closes one end of the respective via hole 62a, 62b, 72a or 72b.

In this structure, during the on-wafer examination, terminals (not shown) of, for example, a waveguide-type probe head (hereinafter referred to as an RF probe) connected with the test machine are connected respectively with the pads 61a, 61b and 63, and a high frequency signal is inputted to the connection pad 63. At the same time, during the on-wafer test, terminals (not shown) of another RF probe are connected respectively with the pads 71a, 71b and 73, and a high frequency signal amplified by the FET 1 is outputted to the test machine through the RF probe by way of the connection pad 73.

On the other hand, although in FIG. 14, each of the via holes 62a, 62b, 72a and 72b has been described having a substantially cylindrical shape, each of those via holes 62a, 62b, 72a and 72b may have an opening of a generally L-shaped configuration having long and short open portions positioned adjacent two sides of the respective test pad 61a, 61b, 71a or 71b that are perpendicular to each other.

Figure 15:
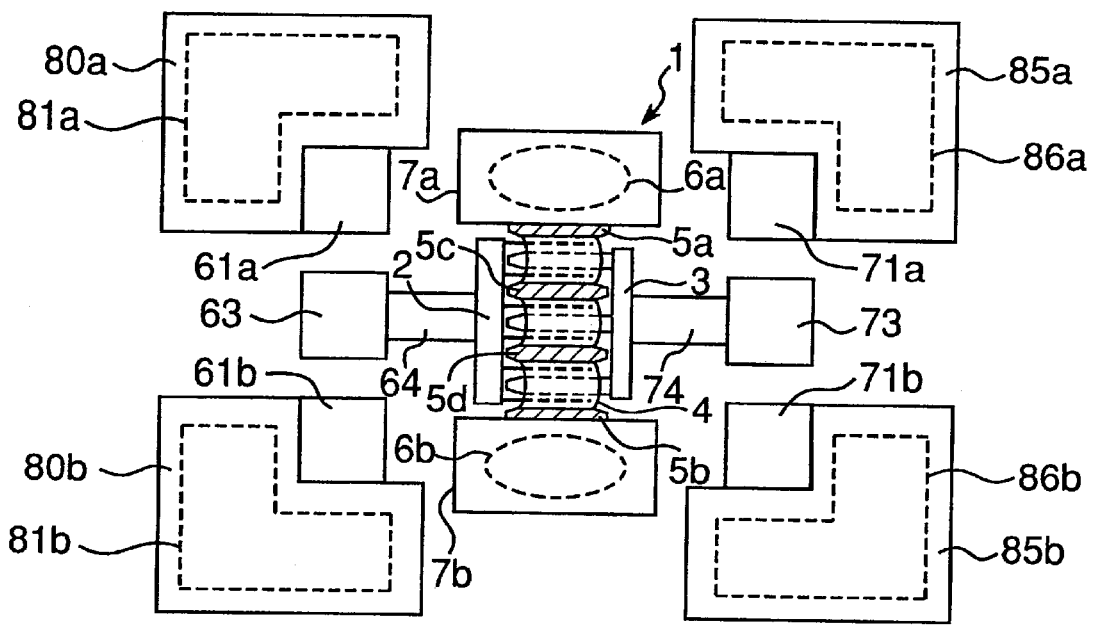
FIG. 15 is a view showing a modification of the semiconductor device according to the fifth embodiment of the present invention.

FIG. 15 illustrates a modification of the semiconductor device shown in FIG. 14. The semiconductor device shown in FIG. 15 is substantially similar to that shown in FIG. 14 except that the test electrodes, shown by 80a, 80b, 85a and 85b in FIG. 15, and the test via holes, shown by 81a, 81b, 86a and 86b in FIG. 15, have respective shapes different from those of the test electrodes 60a, 60b, 70a and 70b and the test via holes 62a, 62b, 72a and 72b both in FIG. 14.

Referring to FIG. 15, each of the test via holes 81a, 81b, 86a and 86b has an opening of a generally L-shaped configuration having long and short open portions positioned adjacent two sides of the respective test pad 61a, 61b, 71a or 71b that are perpendicular to each other. Each via hole 81a, 81b, 86a or 86b has a cross-sectional area larger than that of any of the via holes 6a and 6b in the FET 1.

Each of the test electrodes 80a, 80b, 85a and 85b is of a size sufficient to cover the opening of the corresponding via hole 81a, 81b, 86a or 86b. In the modification shown in FIG. 15, each test electrode 80a, 80b, 85a or 85b is of a generally L-shaped configuration similar to the cross-sectional shape of the corresponding via hole 81a, 82b, 86a or 86b and is of a size larger than the opening of the corresponding via hole 81a, 81b, 86a or 86b. Each test electrode 80a, 80b, 85a or 85b closes one end of respective via hole 81a, 81b, 86a or 86b and is connected with two sides of the corresponding test pad 61a, 61b, 71a or 71b.

Although the modification shown in FIG. 15 has been applied to the FET 1 according to the first embodiment of the present invention, it can be equally applied to any of the second to fourth embodiments of the present invention. However, where the plural via holes are employed for each grounding electrode such as in the FET according to any one of the second to fourth embodiments, the via holes 62a, 62b, 72a and 72b shown in FIG. 14 or the via holes 81a, 81b, 86a and 86b should be formed so as to have the cross-sectional open area thereof which is larger than the sum of the respective cross-sectional open areas of the via holes used for each grounding electrode.

Thus, in the semiconductor device according to the fifth embodiment of the present invention, the test via holes that are used to connect to the ground the predetermined terminals of the RF probe which is necessary during measurement at the time of the on-wafer examination are formed so as to have the cross-sectional open area larger than that of the via hole formed in each grounding electrode in the FET 1. Accordingly, during the on-wafer examination, the unnecessary parasitic inductance resulting from the test via holes that are used to connect the predetermined terminals of the RF probe to the ground can advantageously be reduced to avoid any possible reduction in measurement accuracy at the high frequency region.

<Sixth Embodiment>

In the fifth embodiment, one test via hole has been employed for each test electrode. However, a plurality of test via holes may be employed for each test electrode and this will now be described in connection with a sixth embodiment of the present invention with reference to FIG. 16.

Figure 16:
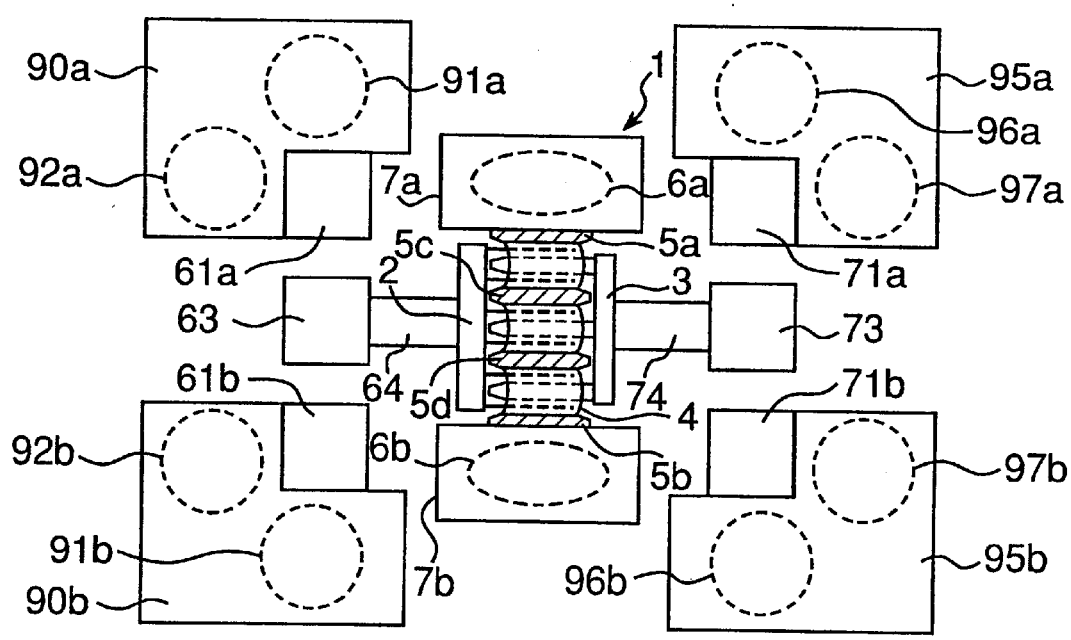
FIG. 16 is a view showing a semiconductor device according to a sixth embodiment of the present invention.

Referring now to FIG. 16, there is shown the semiconductor device according to this sixth embodiment which employs the FET having the gate electrode of the comb-shape and its peripheral component parts. It is to be noted that in FIG. 16, component parts similar to those shown in FIG. 14 are designated by like reference numerals used in FIG. 14 and the details thereof will not be reiterated for the sake of brevity.

The semiconductor device shown in FIG. 16 differs from that shown in FIG. 14 in that, in the semiconductor device of FIG. 16, each of the test electrodes 60a, 60b, 70a and 70b have a shape different from that shown in FIG. 14 and a plurality of test via holes are employed for each test electrode. As shown therein, the FET carrier chip is formed with the test electrodes 90a and 90b which are used during the on-wafer examination and which are connected respectively with the test pads 61a and 61b. The test electrode 90a is connected with the ground through the two test via holes 91a and 92a and the test electrode 90b is connected with the ground through the two test via holes 91b and 92b, and the test pads 61a and 61b are hence connected with the ground.

The FET carrier chip is also formed with the test electrodes 95a and 95b which are used during the on-wafer examination and which are connected respectively with the test pads 71a and 71b. The test electrode 95a is connected with the ground through the two test via holes 96a and 97a and the test electrode 95b is connected with the ground through the two test via holes 96b and 97b, and the test pads 71a and 71b are hence connected with the ground.

Each of the test via holes 91a, 91b, 92a, 92b, 96a, 96b, 97a and 97b is of a substantially cylindrical shape. These test via holes 91a, 91b, 92a, 92b, 96a, 96b, 97a and 97b are so formed that the sum of the respective cross-sectional open areas of the test via holes 91a and 91b, the sum of the respective cross-sectional open areas of the test via holes 92a and 92b, the sum of the respective cross-sectional open areas of the via holes 96a and 96b and the sum of the respective cross-sectional open areas of the via holes 97a and 97b may be larger than the cross-sectional open area of each of the via holes 6a and 6b.

In addition, in, for example, the test via holes 91a and 92a formed in the test electrode 90a, the test via hole 91a is disposed at a location confronting one side of the test pad 61 a while the test via hole 92a is disposed at a location confronting another side of the test pad 61a adjacent such one side thereof. The test via holes 91a and 92a are so formed that the respective diameters and positions thereof will not interfere with each other. Accordingly, the test electrode 90a is of a size sufficient to cover respective openings of the associated test via holes 91a and 92a and is, in the illustrated embodiment, of a generally L-shaped configuration connected with two neighboring sides of the test pad 61a. A description similar to the above equally applied to any of the test electrodes 90b, 95a and 95b and the related test via holes 91b, 92b, 96a, 96b, 97a and 97b and, therefore, the description will not be reiterated for the sake of brevity.

As discussed above, each of the test electrodes 90a, 90b, 95a and 95b does not only cover respective ends of the associated test via holes 91a and 91b, 92a and 92b, 96a and 96b, 97a and 97b, but also are connected with the adjacent two sides of the respective test pad 61a, 61b, 71a or 71b.

In the semiconductor device according to the sixth embodiment, the via holes are so formed that the total cross-sectional open area of the test via holes formed in each of the test electrodes for connecting the predetermined terminals of the RF probe that is necessary during the measurement at the time of on-wafer examination can be larger than the cross-sectional open area of the via hole formed in each of the ground electrode of the FET 1. Accordingly, effects similar to those brought about by the fifth embodiment of the present invention can be obtained. In addition, since the test via holes formed for each of the test electrodes are so formed that the diameters and the positions thereof will not interfere with each other, any possible reduction in strength which would otherwise result from the increased use of the test via holes can be avoided advantageously.

<Seventh Embodiment>

Where a plurality of the FETs are formed on a single wafer in adjoining relation with each other, the test electrodes and the test via holes may be formed so as to be concurrently usable for each neighboring FETs on the wafer, and this will now be described in connection with a seventh embodiment with reference to FIG. 17. As is the case with any of the foregoing embodiments, FIG. 17 illustrates the FET having the comb-shaped gate structure and its peripheral component parts, and the component parts which are shown in FIG. 17 and are similar to those shown in FIG. 16 are designated by like reference numerals used in FIG. 16.

Figure 17:
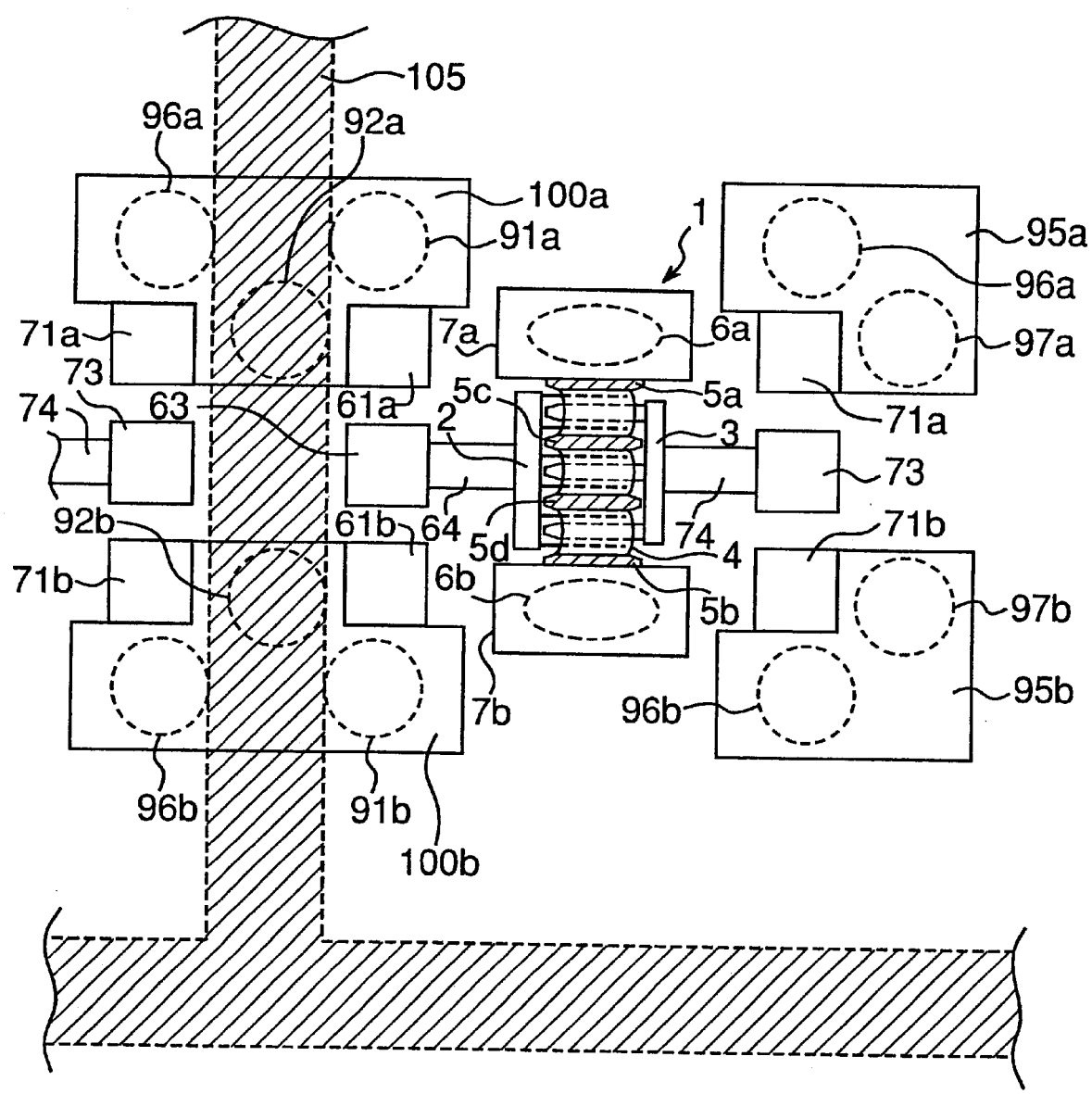
FIG. 17 is a view showing a semiconductor device according to a seventh embodiment of the present invention.

The embodiment shown in FIG. 17 differs from that shown in FIG. 16 in that in the neighboring FETs 1 and their periphery, the test electrodes 90a 90b and the associated via holes 92a and 92b are formed so as to be commonly shared by another FET neighboring the FET 1. Accordingly, the test electrode 90a that is formed so as to be commonly shared is designated by 100a while the test electrode 90b that is formed so as to be commonly shared is designated by 100b.

Referring to FIG. 17, the test electrode 100a is so formed in a configuration with the test electrode 90a for the FET 1 and the test electrode 95a for the FET neighboring the FET 1 overlapping with each other, that a single test via hole can be concurrently used for the test via hole 92a for the FET 1 and the test via hole 97a for the FET neighboring the FET 1, and the test via hole 92a for the FET 1 concurrently forms the test via hole 97a for the FET neighboring the FET 1. Similarly, the test electrode 100b is so formed in a configuration with the test electrode 90b for the FET 1 and the test electrode 95b for the FET neighboring the FET 1 overlapping with each other, that a single test via hole can be concurrently used for the test via hole 92b for the FET 1 and the test via hole 97b for the FET neighboring the FET 1, and the test via hole 92b for the FET 1 concurrently forms the test via hole 97b for the FET neighboring the FET 1.

Also, respective portions of the test via holes 92a and 92b and the test electrodes 100a and 100b are formed on a chip cutting region 105 of a predetermined width along which the semiconductor chip is cut to separate the FET 1 and the FET neighboring the FET 1 from each other.

In this structure, during the on-wafer examination, tests are conducted to the FET 1 and the FET neighboring the FET 1 in a manner similar to that described in connection with the sixth embodiment. After the on-wafer examination, at the time of cutting of the semiconductor chip along the chip cutting region 105 to separate the FET 1 and the FET neighboring the FET 1 from each other, those portions of the test via holes 92a and 92b and the test electrodes 100a and 100b which are formed on the chip cutting region 105 are separated from each other.

Figure 18:
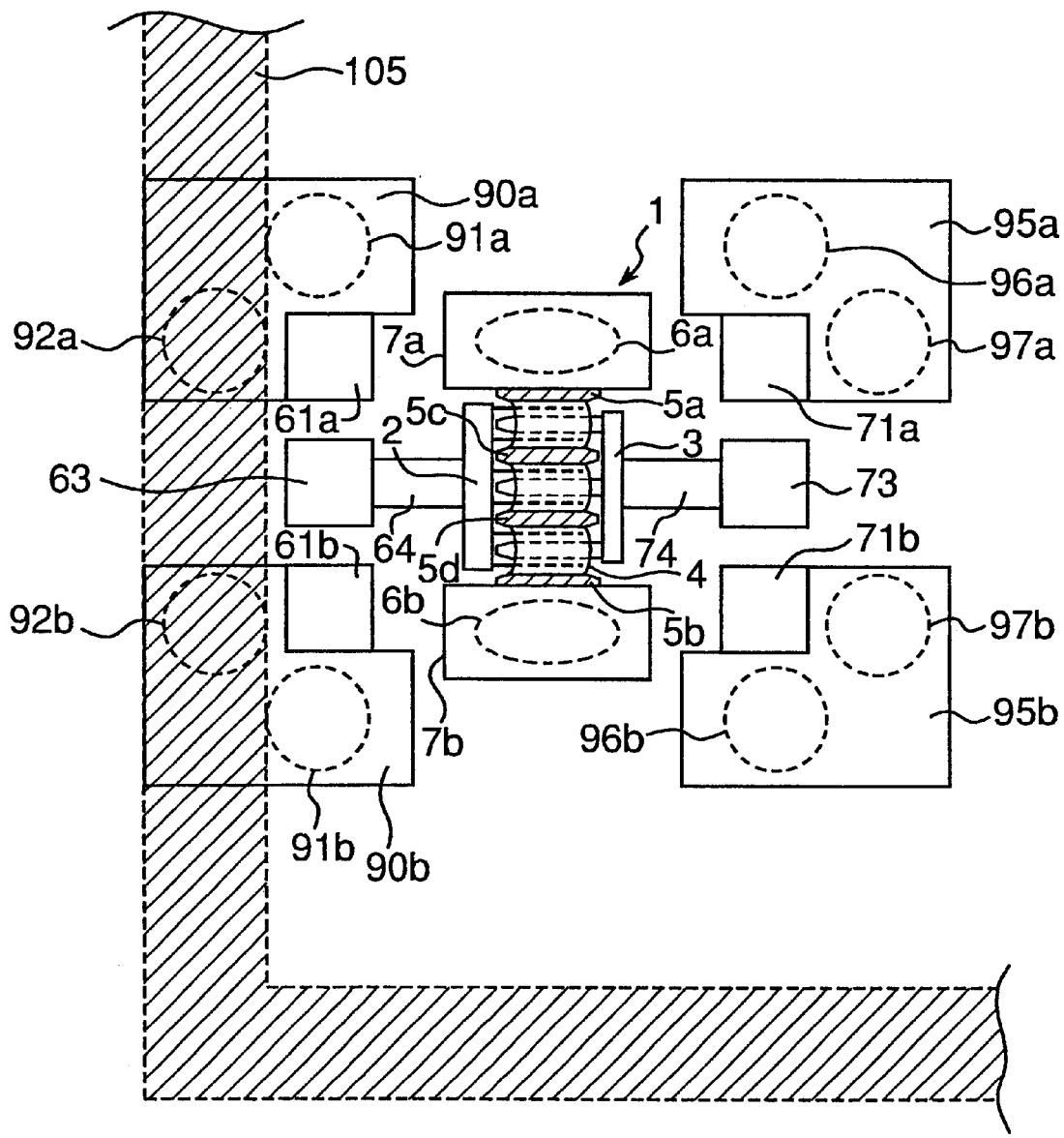
FIG. 18 is a view showing a modification of the semiconductor device according to the seventh embodiment of the present invention.
Figure 19:
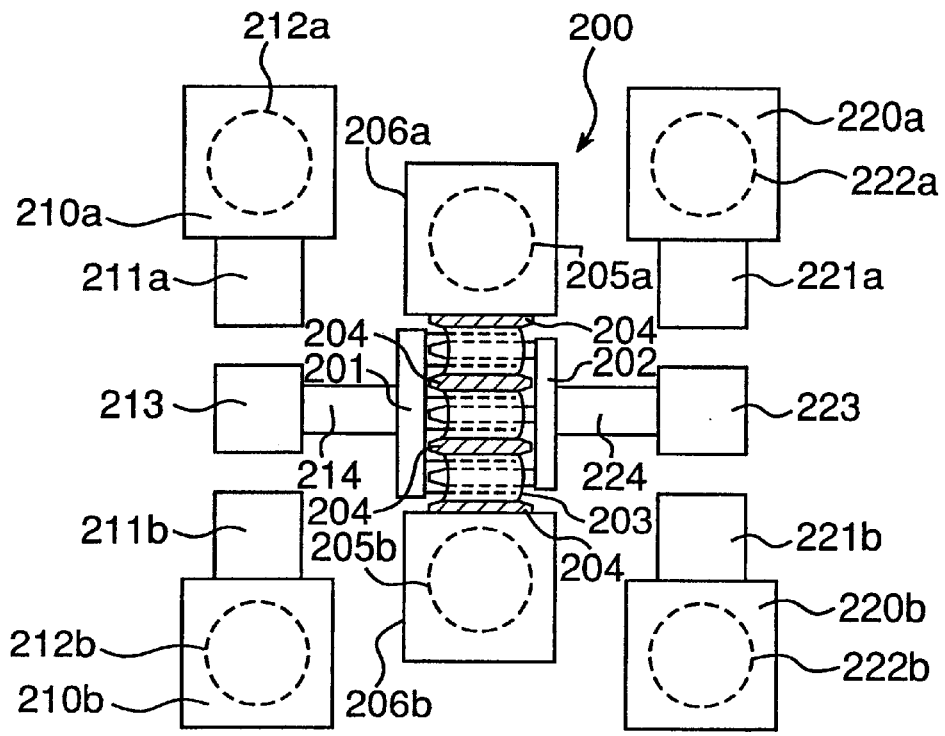
FIG. 19 is a view showing the prior art field-effect transistor having a comb-shaped gate structure.
Figure 20:
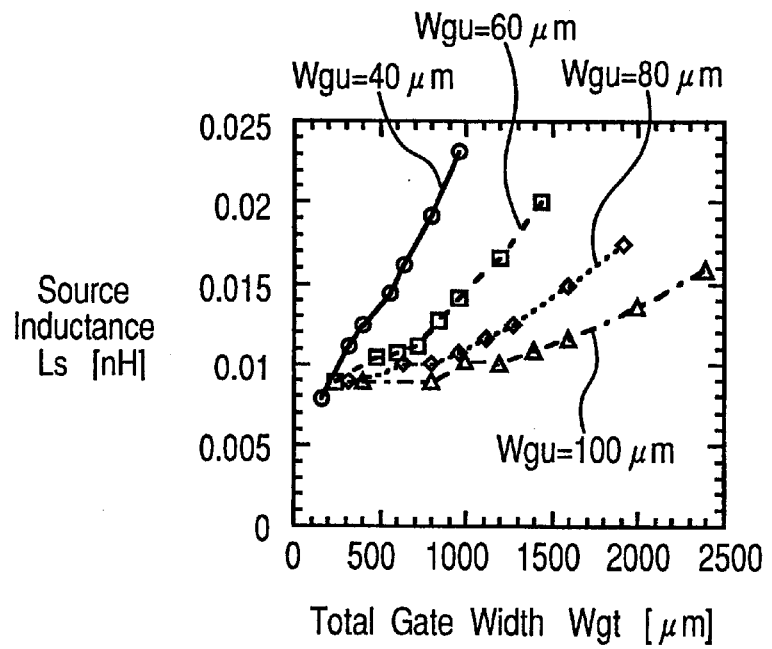
FIG. 20 is a graph showing a relation between the source inductance Ls, the unit gate width Wgu and the total gate width Wgt of a field effect transistor 200 shown in FIG. 19.
Figure 21:
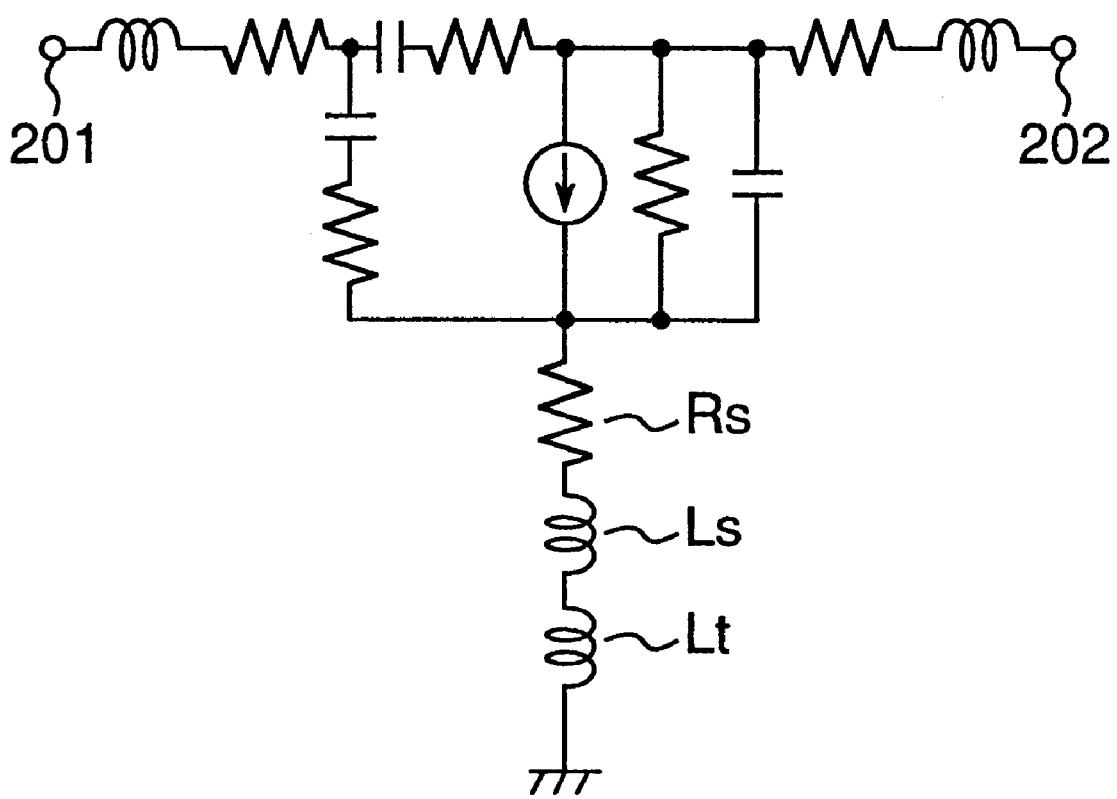
FIG. 21 is a diagram showing an equivalent circuit of the field-effect transistor 200 during the on-wafer examination.

In describing the embodiment of FIG. 17, reference has been made to the two neighboring FETs. However, where the FET 1 is formed at one end of the semiconductor chip, such a layout as shown in FIG. 18 is employed. In describing the modification shown in FIG. 18, like parts used in FIG. 18 and similar to those shown in any of FIGS. 16 and 17 are designated by like reference numerals used in any of FIGS. 16 and 17.

Referring to FIG. 18, respective portions of the test via holes 92a and 92b and the test electrodes 90a and 90b are formed on the chip cutting region 105 and, at the time of cutting along the chip cutting region 105 that is carried out after the on-wafer examination, those respective portions of the test via holes 92a and 92b and the test electrodes 90a and 90b, which are formed on the chip cutting region 105 are separated from each other.

Thus, in the semiconductor device according to the seventh embodiment of the present invention, those portions of the test via holes and the test electrodes are formed on the chip cutting region 105 and, at the time of cutting the chip along the chip cutting region 105 after the on-wafer examination, those portions are separated from each other. Accordingly, not only can effects similar to those brought about by the sixth embodiment be appreciated, but also unnecessary portions for the FET can advantageously be reduced, making it possible to miniaturize the semiconductor chip that is used to fabricate the FET.

While in any of the sixth and seventh embodiments of the present invention, the examples has been described in which two test via holes are formed for each test electrode, the present invention may not always be limited thereto and can equally apply where three or more via holes are formed for each test electrode and, in such case, the test via holes are arranged in a generally L-shaped configuration along the neighboring two sides of the corresponding test electrode. Also, although in any of the sixth and seventh embodiments of the present invention, each test via hole formed for the test electrode has been shown as having a cylindrical shape, the present invention may not be always limited thereto, but may equally apply even where each test via hole has a generally polygonal cross-sectional shape.

In addition, any of the sixth and seventh embodiments of the present invention has been described as applied to the FET 1 according to the first embodiment thereof, but can equally apply to the FET according to any of the second to fourth embodiments, the details of which are not reiterated for the sake of brevity. It is, however, to be noted that where the plural test via holes are formed for each test electrode such as in the FET according to any of the second to fourth embodiments, the test via holes should be so formed for each test electrode that the sum of the cross-sectional open areas of those plural via holes formed for each test electrode may be larger than the sum of the cross-sectional open areas of the via holes formed for each test electrode.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A semiconductor device comprising:
a field-effect transistor having
a gate electrode,
a drain electrode with a comb-shaped structure having fingers extending toward said gate electrode, and
an array of source electrodes arranged parallel to respective fingers of said drain electrode and electrically connected with each other by electrical conductors, and
a pair of grounding electrodes connected to two of the source electrodes positioned at respective extremities of the array, each of said grounding electrodes having a via hole with an elliptical cross-section and a major axis parallel to each source electrode.

2. The semiconductor device according to claim 1, including a semiconductor substrate having a front surface where said field-effect transistor is located, a rear surface, and a recess in the rear surface where said via hole penetrating through said semiconductor substrate is located.

3. The semiconductor device according to claim 1, further comprising at least one test pad which may be connected with a test machine when a test is conducted, at least one test electrode connected with the test pad, and a test via hole in the test electrode for connecting the test electrode to the ground, said test via hole having a cross-sectional area larger than the via hole for each grounding electrode.

4. The semiconductor device according to claim 3, wherein the test via hole has a diameter larger than the elliptical via hole measured along its major axis.

5. The semiconductor device according to claim 1, further comprising at least one test pad which may be connected with a test machine when a test is conducted, at least one test electrode being connected with the test pad, and a plurality of test via holes in the test electrode connecting the test electrode to the ground, the sum of the respective cross-sectional areas of said test via holes being larger than the cross-sectional area of the via hole in each grounding electrode.

6. A semiconductor device comprising:
a semiconductor substrate having a front surface and a rear surface;
a field-effect transistor located at the front surface of said semiconductor substrate and having
a gate electrode,
a drain electrode with a comb-shaped structure having fingers extending toward said gate electrode, and
an array of source electrodes arranged parallel to respective fingers of said drain electrode and electrically connected with each other by electrical conductors, and
a pair of grounding electrodes each having a plurality of via holes through which the grounding electrode is grounded, said semiconductor substrate having a recess in the rear surface where at least one of said via holes is located.

7. The semiconductor device according to claim 6, wherein the via holes are provided in correspondence with the respective grounding electrodes and are arranged symmetrically with respect to an axis of the array of the source electrodes.

8. A semiconductor device comprising:
a field-effect transistor having
a gate electrode,
a drain electrode with a comb-shaped structure having fingers extending toward said gate electrode, and
an array of source electrodes arranged parallel to respective fingers of said drain electrode and electrically connected with each other by electrical conductors, and
a pair of grounding electrodes each having a plurality of via holes through which the grounding electrode is grounded, wherein at least one of the via holes provided for one grounding electrode is located in the vicinity of, but spaced from, at least one of the drain electrode and the gate electrode, and wherein each of said grounding electrodes has an end portion located close to the via hole, in the vicinity of at least one of the drain electrode and the gate electrode, said end portion of each grounding electrode being electrically connected to an adjacent source electrode by a conductor.

9. A semiconductor device comprising:
a field-effect transistor having
a gate electrode,
a drain electrode with a comb-shaped structure having fingers extending toward said gate electrode, and
an array of source electrodes arranged parallel to respective fingers of said drain electrode and electrically connected with each other by electrical conductors,
a pair of grounding electrodes each having a plurality of via holes through which the grounding electrode is grounded; and
at least one test pad which may be connected with a test machine when a test is conducted, at least one test electrode connected to said test pad, and a test via hole in said test electrode for connecting said test electrode to a ground, said test via hole having a cross-sectional area larger than the sum of respective cross-sectional areas of said via holes for each grounding electrode.

10. A semiconductor device comprising:
a field-effect transistor having
a gate electrode,
a drain electrode with a comb-shaped structure having fingers extending toward said gate electrode, and
an array of source electrodes arranged parallel to respective fingers of said drain electrode and electrically connected with each other by electrical conductors,
a pair of grounding electrodes each having a plurality of via holes through which the grounding electrode is grounded; and
at least one test pad which may be connected with a test machine when a test is conducted, at least one test electrode connected to said test pad, and a plurality of test via holes in said test electrode connecting said test electrode to ground, the sum of the respective cross-sectional areas of said test via holes being larger than the sum of the cross-sectional areas of the via holes in each grounding electrode.

11. The semiconductor device according to claim 10, including a semiconductor wafer having a plurality of chip areas separated by chip cutting regions, each chip area including one of said semiconductor devices, wherein respective portions of at least one of the test via holes and the test electrode having the test via hole therein are located on a chip cutting region of the semiconductor wafer along which the semiconductor wafer is cut to produce semiconductor chips, such that when the semiconductor wafer is cut along the chip cutting region, the test via hole and the test electrode are separated from each other.

12. The semiconductor device according to claim 11, wherein said respective portions of the test via hole and the test electrode are concurrently used by respective field-effect transistors located on the semiconductor wafer in neighboring chip areas.

\* \* \* \* \*